United States Patent
Kirsch et al.

[11] Patent Number: 5,867,445
[45] Date of Patent: Feb. 2, 1999

[54] LOCAL WORD LINE DECODER FOR MEMORY WITH 2 MOS DEVICES

[75] Inventors: Howard C. Kirsch, Austin, Tex.; Yen-Tai Lin, Hsinchu, Taiwan

[73] Assignee: Vanguard International Semiconductor Corporation, Hsin-Chu, Taiwan

[21] Appl. No.: 944,571

[22] Filed: Oct. 6, 1997

[51] Int. Cl.$^6$ .............................. G11C 8/00; G11C 16/04
[52] U.S. Cl. .............................. 365/230.06; 365/189.05; 365/230.08
[58] Field of Search .............................. 365/230.06, 200, 365/189.05, 230.08

[56] References Cited

U.S. PATENT DOCUMENTS

| | | | |
|---|---|---|---|
| 5,446,698 | 8/1995 | McClure | 365/230.03 |
| 5,555,529 | 9/1996 | Hose, Jr. et al. | 365/230.06 |
| 5,587,960 | 12/1996 | Ferris | 365/230.03 |
| 5,608,678 | 3/1997 | Lysinger | 365/200 |
| 5,612,918 | 3/1997 | McClure | 365/200 |
| 5,648,933 | 7/1997 | Slemmer | 365/200 |

*Primary Examiner*—David Nelms
*Assistant Examiner*—Trong Phan
*Attorney, Agent, or Firm*—George O. Saile; Stephen B. Ackerman

[57] ABSTRACT

A method and a circuit are disclosed by which the semiconductor area is reduced that a local word line decoder for a memory array requires. This reduction in area size has been achieved by eliminating one transistor of a three transistor local wordline decoder and by reducing the number of inputs to the decoder from three to two. The reduction in inputs is made possible by the method of applying to one of the inputs, when low, a voltage signal $v_b$ which is at least one threshold lower than the voltage signal to the other input, when low. This voltage $v_b$ can be derived from the p-substrate bias voltage.

8 Claims, 3 Drawing Sheets

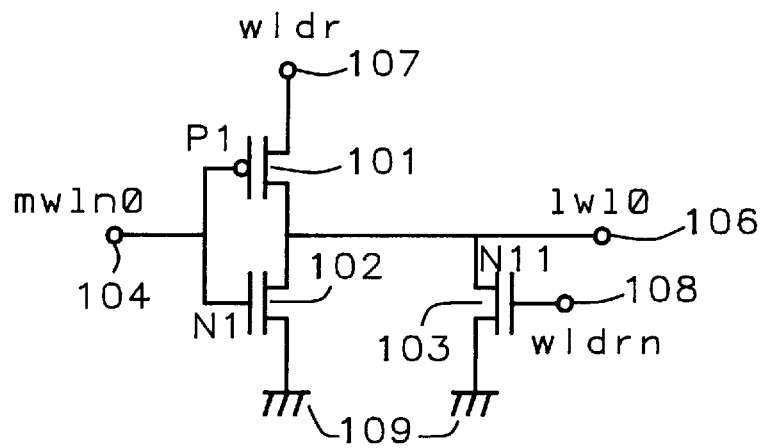
*FIG. 1 - Prior Art*
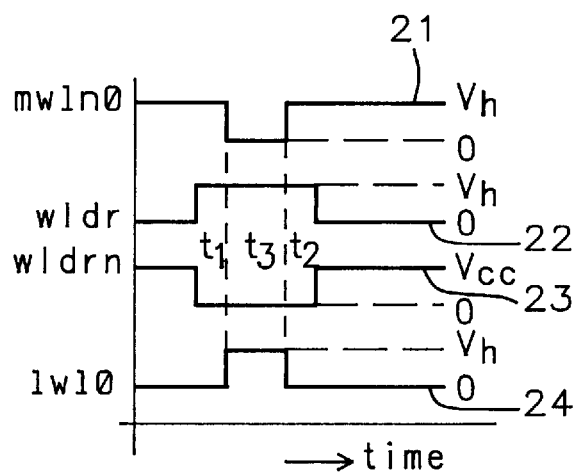
*FIG. 2 - Prior Art*

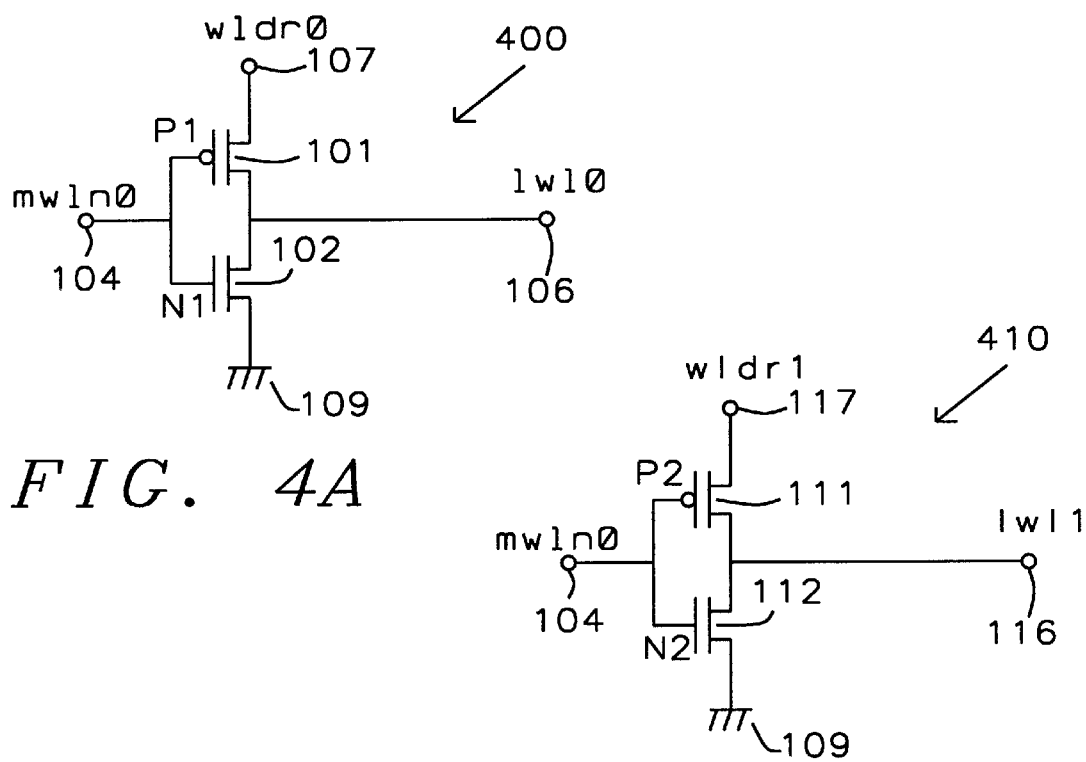
FIG. 4A
FIG. 4B
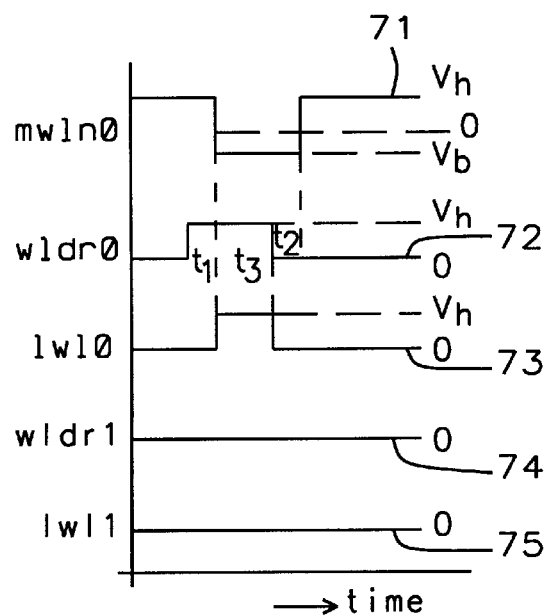
FIG. 5

LOCAL WORD LINE DECODER FOR MEMORY WITH 2 MOS DEVICES

BACKGROUND OF THE INVENTION

1. Field of the Invention

The invention relates to the field of semiconductor memory arrays, and in particular to reducing the semiconductor area of a wordline decoder.

2. Description of the Related Art

A prior art circuit for a local wordline decoder is shown in FIG. 1. Referring now to FIG. 1, P-channel transistor 101 (P1) and n-channel transistor 102 (N1) are connected in series between wordline driver input 107 (wldr) and a reference potential 109. Input 104 (mwln0) connects to the gates of transistor 101 and 102. Output 106 (lwl0) is connected to the junction of transistors 101 and 102. Drain and source of n-channel transistor 103 (N11) are connected between output 106 and reference potential 109, respectively. The gate of transistor 103 is connected to input 108 (wldrn), which is the inverse of input 107.

Referring now to FIG. 2, we show the input and output signals of the circuit of FIG. 1. Curve 21 represents input mwln0 (104) swinging from $v_h$ to logical zero during period $t_3$. Curves 22 and 23 depict wordline driver inputs wldr 107 and wldrn 108 respectively. Curves 22 and 23 are shown to rise/fall $t_1$ time before, and $t_2$ time after period $t_3$. $t_1$ and $t_2$ are guard zones around $t_3$ to insure against unavoidable skew in the rise and fall of all three input signals. Curve 24 represents the local wordline decoder output lwl 106 and is shown selected during period $t_3$, having swung from logical zero to $v_h$.

U.S. Pat. No. 5,446,698 (McClure) discloses a redundant global wordline for local wordlines, however, the details of the local wordline decoder are not discussed. U.S. Pat. No. 5,587,960 (Ferris) describes a semiconductor memory with sub-wordlines but does not describe the details of the sub-wordline decoder. U.S Pat. No. 5,555,529 (Hose, Jr. et al) describes the use of a wordline decoder between a global wordline and a pair of even/odd wordlines, but the details of the wordline decoder are not disclosed.

SUMMARY OF THE INVENTION

It is an object of the present invention to provide a method and a circuit to reduce the semiconductor area that a local word line decoder for a memory array requires.

It is another object of the present invention to reduce the chip size required for a memory array.

A further object of the present invention is to reduce the number of inputs to the local wordline decoder from three to two.

These objects have been achieved by eliminating one transistor of a three transistor local wordline decoder. The reduction in inputs is made possible by applying to one of the inputs a voltage signal which is at least one threshold lower than the voltage signal to the other input, ensuring that the output signal can be held at logical zero when both inputs are at logical zero. This lower voltage can be derived from the p-substrate bias voltage.

BRIEF DESCRIPTION OF THE DRAWINGS

FIG. 1 is a circuit diagram of one embodiment of a prior art wordline decoder.

FIG. 2 is a view of the input and output signals of the circuit as shown in FIG. 1.

FIGS. 4a and 4b are a circuit diagram of the preferred embodiment of the local wordline decoder of the present invention.

FIG. 5 is a view of the input and output signals of the circuit as shown in FIGS. 4a and 4b.

DESCRIPTION OF THE PREFERRED EMBODIMENT

Figure 3:
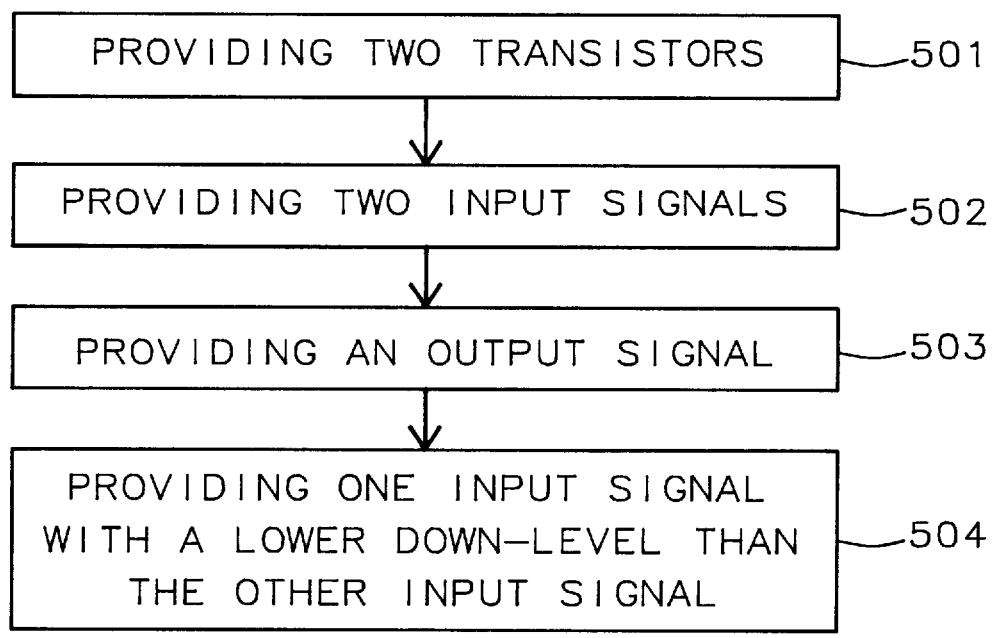
FIG. 3 is a block diagram of the method of the present invention.

Referring now to the block diagram of FIG. 3, we show a method of the present invention providing a two transistor local wordline decoder for a semiconductor memory. Block 501 provides a two transistor circuit. Block 502 provides two input signals for the two transistor circuit of Block 501. Block 503 provides an output signal for the local wordline decoder. Block 504 provides one input signal with a lower down-level than the other input signal. The lower down-level of one input ensures that the output signal of Block 503 can reliably be kept at a down-level when both input signals are at a down-level.

Referring now to FIGS. 4a and 4b, we show circuit diagrams 400 and 401 depicting the preferred embodiment of the present invention. The local wordline decoder 400 comprises a first input mwln0 (main wordline 0, 104) with a first signal applied, a second input wldr0 (wordline driver 0, 107) with a second signal applied, and an output lwl0 (local wordline 0, 106) providing an output signal. The local wordline decoder activates output lwl0, by swinging to up level $v_b$, when the first signal supplies a down level and the second signal supplies an up voltage level. The local wordline decoder comprises a p-channel and a n-channel transistor. The first signal, applied to input mwln0 (104), has a down voltage level which is lower than the down voltage level of the second signal applied to input wldr0 (107). The down voltage level of the first input mwln0 is arranged to be at least one threshold below the down voltage level of the second input wldr, it must follow the equation:

$$V_b < -|V_{TP}|$$

where $V_{TP}$ is the threshold voltage of a p-channel transistor. One method to generate $v_b < -|V_{TP}|$ is to utilize the p-substrate bias voltage $v_{bb}$. A lower down voltage for the signal applied to input mwln0 (104) is selected to guarantee that the p-channel transistor keeps conducting when the signals for inputs mwln0 and wldr0 are both at a down voltage level, i.e. $v_b$ and logical zero respectively, thereby ensuring that the signal at output lwl0 can be held at logical zero. Otherwise output lwl0 might float and become susceptible to noise during time $t_2$.

Still referring to circuit 400 of FIGS. 4a and 4b, the local wordline decoder comprises p-channel transistor 101 (P1) connected serially to n-channel transistor 102 (N1) First input mwln0 (main word line 0, 104) connects to the gates of p-channel transistor 101 and n-channel transistor 102. The junction of transistors 101 and 102 is connected to local wordline output lwl0 (106). The source of p-channel transistor 101 is attached to the second input wldro (wordline driver 0, 107); the source of n-channel transistor 102 is attached to a reference potential 109.

Still referring to FIGS. 4a and 4b, we show circuit diagram 401 depicting a circuit similar to circuit 400 but decoding main wordline 0 (104) together with wordline driver 1 (wldr1, 117). The output is local wordline 1 (lwl1, 116). Transistors are arranged identical to circuit 400, except that p-channel transistor P2 (111) replaces transistor P1, and n-channel transistor N2 (112) replaces transistor N1. P-channel transistors P1 and P2 and n-channel transistors N1 and N2 form a 2 by 2 matrix and are placed in close proximity to each other.

Referring now to FIG. 5, we show the input and output signals of the circuit of FIG. 6. Curve 71 represents input mwln0 (104) swinging between voltages $v_h$ and $v_b$. Curve 72 shows the wordline driver input wldr0 (107) going positive to $v_h$ some time ($t_1$) before period $t_3$ and switching back to logical zero some time ($t_2$) after the end of period $t_3$. Times $t_1$ to $t_3$ are not to scale, and for illustrative purposes only. $t_1$ and $t_2$ represent the skew between inputs mwln0 and wldr0 switching. During $t_2$, when both inputs are down, transistor P1 must be kept conducting by keeping its gate biased at $v_b$, which is at least one threshold below its source. This guarantees that during $t_2$ transistor P1 provides a low impedance and that output lwl0 can be held at logical zero. Curve 73 depicts selection of output lwl0 (106) by swinging from logical zero to $v_h$ for the period $t_3$.

Curve 74 depicts input wldr1 (117) to circuit 410 at logical zero level, resulting in circuit 410 not being selected. Consequently the output of circuit 410 will show no switching action and maintains a logical zero level (Curve 75). Note that input mwln0 (104) to circuit 410 is at voltage $v_b$ during times $t_3$ and $t_2$ causing transistor P2 to conduct during this period and forcing the logical zero level of wldr1 (117) onto output lwl1 (116). If P2 were not conducting, output lwl1 would float and be susceptible to noise because it would present a high impedance.

The advantages of this present invention are a reduced size local wordline decoder (from three cells to two cells), which results in a reduction of the chip size and an improvement of cell utilization. The improvement is significant since, as the device fabrication process moves to 0.35 μm and 0.25 μm, cell size is shrinking faster than wordline pitch calling for local word line decoders for each main wordline. With the use of local wordlines the decoder size in turn needs to be reduced since many decoder circuits are required. The significant reduction in local wordline decoder size from three transistors (three cells) to two transistors (two cells) is made possible through the novel use of a lower down voltage level for one input, ensuring that the output signal can be held at logical zero when the other input is at logical zero as well.

While the invention has been particularly shown and described with reference to the preferred embodiments thereof, it will be understood by those skilled in the art that various changes in form and details may be made without departing from the spirit and scope of the invention.

What is claimed is:

1. A method for providing decoding with a local word line decoder in a semiconductor memory, comprising:

providing a first and a second transistor, where the gate of said first transistor and the gate of said second transistor is connected to a first input;

providing a first input signal, applied to said first input;

connecting said first transistor and said second transistor in series between a second input and a reference potential;

providing a second input signal, applied to said second input;

providing an output signal at an output, said output connected to the function of said first transistor and said second transistor; and providing a down level for said first input signal which is lower in electrical potential than a down level of said second input signal.

2. The method of claim 1, wherein said first input signal supplies a down voltage level equal to a p-substrate bias voltage.

3. A local wordline decoder circuit for a semiconductor memory, comprising:

said local wordline decoder having a first input mwln with a first signal applied and a second input wldr with a second signal applied, and an output lwl with an output signal;

said local wordline decoder activating said output signal at said output lwl when said first signal is at a down voltage level and said second signal is at an up voltage level;

a first and a second metal oxide semiconductor transistor, connected in series between said second input wldr and a reference potential; and said first signal having a down voltage level that is lower than a down voltage level of said second signal.

4. The circuit of claim 3, wherein said down voltage level of said first signal applied to said first input is at least one threshold below said down voltage level of said second signal applied to said second input.

5. The circuit of claim 3, wherein said down voltage level of said first signal applied to said first input is equal in voltage to a p-substrate bias voltage $v_{bb}$.

6. The circuit of claim 3, wherein said first transistor is conducting when said first signal supplies a down voltage level while said second signal supplies a down voltage level.

7. The circuit of claim 3, wherein said output lwl is held near said reference potential when said first signal supplies a down voltage level while said second signal supplies a down voltage level.

8. The circuit of claim 3, wherein said first transistor is in close proximity to said second transistor.

* * * * *